United States Patent [19]

Shimizu

[11] Patent Number: 4,913,984

[45] Date of Patent: Apr. 3, 1990

[54] OPENING/CLOSING DEVICE FOR BATTERY COVER

[75] Inventor: Hitoshi Shimizu, Tokyo, Japan

[73] Assignee: Asahi Kogaku Kogyo Kabushiki Kaisha, Tokyo, Japan

[21] Appl. No.: 386,478

[22] Filed: Jul. 28, 1989

[30] Foreign Application Priority Data

Aug. 23, 1988 [JP] Japan .................. 63-208850

[51] Int. Cl.⁴ ............................................. H01M 2/02
[52] U.S. Cl. ....................................... 429/97; 429/48; 220/323
[58] Field of Search ..................... 429/48, 97; 220/323

[56] References Cited

U.S. PATENT DOCUMENTS

| 4,230,777 | 10/1980 | Gatto | 429/97 |
| 4,399,201 | 8/1983 | Nagamara | 429/97 X |
| 4,493,880 | 1/1985 | Lund | 429/97 |

FOREIGN PATENT DOCUMENTS 60-254556 12/1985 Japan .
63-31086 2/1988 Japan .
1100999 4/1989 Japan .

Primary Examiner—Stephen J. Kalafut
Attorney, Agent, or Firm—Sughrue, Mion, Zinn, Macpeak & Seas

[57] ABSTRACT

A battery cover opening/closing device which prevents a battery from being opened when the power switch is in the on position and prevents the switch from being turned on when the cover is not completely closed. The device includes a cover opening member (21), a power switch manipulator (51) for turning on and off the power switch for the battery and a safety mechanism for enabling the opening operation of the cover opening member (21) only when the power switch manipulator (51) is in the position of turning off the power switch. The safety mechanism comprises a slide-locking plate (14) having an opening/closing hole means (20) in which a bar coupled to the member integrally therewith is fitted. The opening/closing hole means includes an entry hindrance hole (20b) which does not allow the member (21) to be pressed to open the cover when the manipulator is in the position of turning on the power switch and an entry allowance hole (20a) which is continuous to the entrance hindrance hole (20b) and allows the member (21) to be pressed to open the cover when the manipulator is in the position of turning off the switch.

3 Claims, 3 Drawing Sheets

OPENING/CLOSING DEVICE FOR BATTERY COVER

BACKGROUND OF THE INVENTION

1. Field Of The Invention

The present invention relates to a device for opening and closing a cover for a battery which is the power supply of an appliance.

2. Background

In a conventional appliance such as a magnetic recording camera, a lap-top wordprocessor and a personal computer, which has a battery as a power supply and a magnetic recorder for recording and reproducing information onto and from a floppy disk, the disk is plastically deformed if a pad for holding the disk and a magnetic head for recording the information onto the disk are left in the recording positions thereof for a long time during the non-rotation of the disk, namely, during the non-recording period. For that reason, a mechanism for moving the pad and the magnetic head away from the floppy disk by a solenoid or the like is provided in the appliance to prevent the disk from being plastically deformed. However, since the mechanism is the type which driven by the battery, the mechanism does not function if a cover for the battery is opened and the battery is taken out from the appliance before a power switch is turned off. This is a problem.

SUMMARY OF THE INVENTION

The present invention was made in order to solve the problem. Accordingly, it is an object of the present invention to provide a battery cover opening/closing device which functions so that a cover for a battery cannot be opened when a power switch remains turned on and that the switch cannot be turned on when the cover is not completely closed.

The device provided in accordance with the present invention includes a cover opening member for opening the battery cover, and a power switch manipulator for turning on and off the power switch for the battery and is characterized in that a safety mechanism for enabling the opening operation of the cover opening member only when the power switch manipulator is in the position of turning off the power switch is provided between the member and the manipulator. The cover opening member and the power switch manipulator may be of either the type which is slid for operation or of the type which is pressed for operation. If the member is of the type of being pressed for operation and the manipulator is of the type which is slid for operation, a slide-locking plate is provided on the manipulator integrally therewith. The slide-locking plate includes an opening/closing hole means in which a bar coupled to the member integrally therewith is fitted. The opening/closing means consists of an entry hindrance hole which does not allow the member to be pressed and moved to open the cover when the manipulator is in the position of turning on the power switch, and an entry allowance hole which is continuous to the entry hindrance hole and allows the member to be pressed and moved to open the cover when the manipulator is in the position of turning off the switch. On the other hand, if the cover opening member is the type which is slid for operation and the power switch manipulator is the type which is pressed for operation, a slide-locking plate is provided on the member integrally therewith and has an opening/closing hole means in which a bar coupled to the manipulator integrally therewith is fitted. The opening/closing hole means consists of an entry hindrance hole which does not allow the member to be slid to open the cover when the manipulator is in the position of turning on the power switch, and an entry allowance hole which is continuous to the entry hindrance hole and allows the member to be slid to open the cover when the manipulator is in the position of turning off the switch.

BRIEF DESCRIPTION OF THE DRAWINGS

FIG. 3 shows that a slide-locking plate is in a locking position when a power switch is on, FIG. 4 shows that the slide-locking plate is in an unlocking position when the power switch is off.

DETAILED DESCRIPTION OF THE PREFERRED EMBODIMENT

Embodiments of the present invention are hereafter described with reference to the drawings attached hereto.

Figure 1:
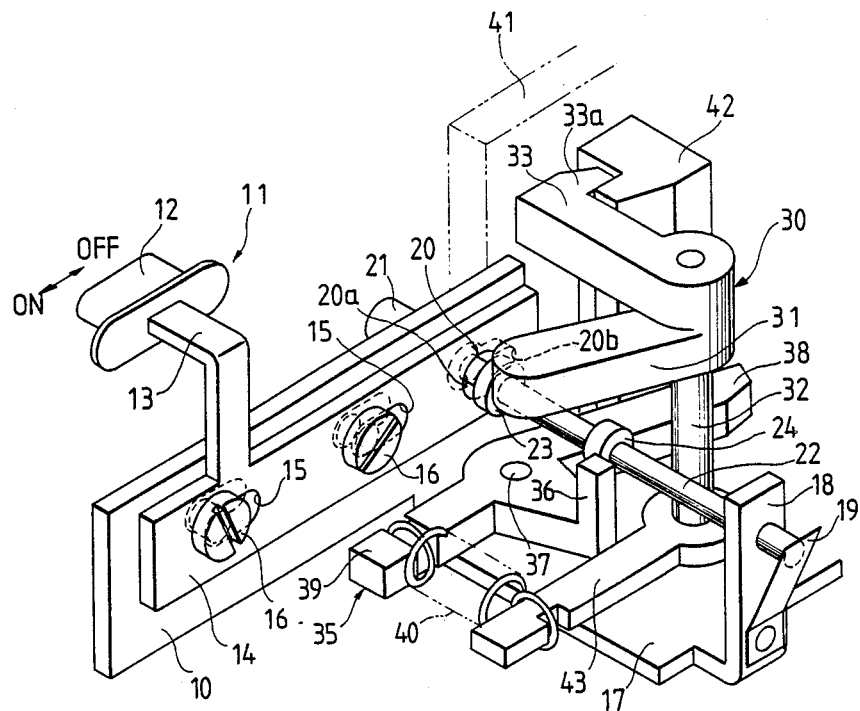
FIG. 1 is a perspective view of a device which is an embodiment of the present invention and is for opening and closing a cover for a battery.

FIG. 1 is a perspective view of a device for opening and closing a cover for a battery for a magnetic recorder whose internal mechanism is driven by the electric power of the battery. In the device, the main plate 10 of the magnetic recorder is coupled with a power switch manipulator 11 and a cover opening/closing button 21. The manipulator 11 is of the type which is slid to turn either on or off a power switch (not shown). The button 21 is the type that is pressed for operation. The manipulating portion 12 of the power switch manipulator 11 and the cover opening/closing button 21 project from the outside surface of the main plate 10 and are located near each other. The cover 41, for opening and closing a battery accommodation opening, is disposed near the main plate 10. The manipulating portion 12 of the manipulator 11 is coupled to a slide-locking plate 14 by the bent coupling portion 13 of the manipulator. The plate 14 has a pair of slender guide holes 15 in which a pair of large-headed pins 16 projecting from the inside surface of the main plate 10 are fitted so that the slide-locking plate is horizontally slidable in the longitudinal direction of the main plate. As a result, when the manipulating portion 12 of the manipulator 11 is moved rightward or leftward, the slide-locking plate 14 is slid rightward or leftward so that the power switch is turned on or off.

The cover opening/closing button 21 is coupled with an opening/closing bar 22 of smaller diameter than the button and coaxial to the bar. The button 21 extends through the main plate 10 and the slide-locking plate 14. The bar 22 is supported at the inner end thereof by a lug 18 provided at the end of a bottom plate 17 extending inward from the main plate 10, and can be moved in a direction perpendicular to the direction of sliding of the slide-locking plate 14. A plate spring 19 is attached to the lug 18 and urges the button 21 in such a direction as to normally protrude the button from the outside surface of the main plate 10. A push flange 23, which is engaged with a moving connection arm 31 of a cover opening/closing arm means 30 to push the arm, and an engaging flange 24, which can be engaged with an, disengaged from an engaging projection 36 of a cover moving connection arm 35, are provided on the bar 22 integrally therewith.

The slide-locking plate 14 has an opening/closing hole means 20 in a position corresponding to that of the cover opening/closing button 21. The hole means 20 consists of an entry allowance hole 20a whose diameter is large enough to allow the button 21 to enter into the hole, and an entry hindrance hole 20b whose diameter is small enough to hinder the button from entering into the hole. The diameter of the entry allowance hole 20a corresponds to that of the button 21. When the power switch manipulator 11 is in the position of turning off the power switch, the position of the entry allowance hole 20a coincides with that of the button 21. The diameter of the entry hindrance hole 20b corresponds to that of the opening/closing bar 22. When the power switch manipulator 11 is in the position of turning on the power switch, the position of the entry hindrance hole 20b coincides with that of the bar 22.

The cover opening/closing arm means 30 is secured to the top of a rotary pin 32 supported on the bottom plate 17. An engaging arm 33 having an engaging claw 33a, which is engaged with and disengaged from an engaging portion 42 formed on the inside surface of the battery cover 41, and the moving connection arm 31, which is put in contact with the push flange 23 of the opening/closing bar 22, are included in the arm means 30. A spring force transmission arm 43 is secured to the bottom of the rotary pin 32.

The cover moving connection arm 35 is pivotally coupled to the bottom plate 17 by a rotary shaft 37 so that the arm is moved in conjunction with the opening and closing of the battery cover 41. The arm 35 includes a moving connection part 38 in contact with the inside surface of the cover 41, the engaging projection 36, which is engaged with and disengaged from the engaging flange 24 of the opening/closing bar 22, and a spring engaging portion 39. A tension spring 40 engaged with the spring engaging portion 39 and the spring force transmission arm 43 urges the cover moving connection arm 35 in such a direction as to push the moving connection part 38 of the cover moving connection arm 35 onto the inside surface of the cover 41 to open the cover, and urges the spring force transmission arm in such a direction as to engage the engaging arm 33 of the cover opening/closing arm means 30 with the engaging portion 42 of the cover.

Figure 2A:
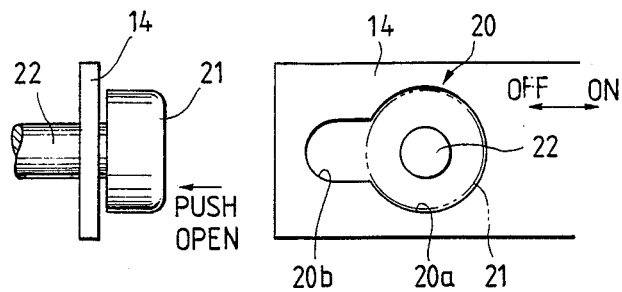
FIG. 2A is an explanatory view showing that the cover is closed when a power switch is off.
Figure 2B:
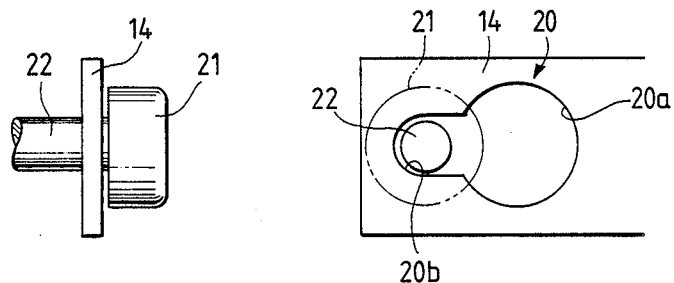
FIG. 2B is an explanatory view showing that the cover is closed when the power switch is on and FIG. 2C is an explanatory view showing that the cover is opened as the power switch is off.
Figure 2C:
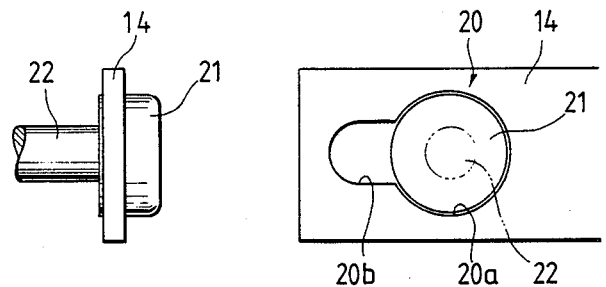

Because of the above-described constitution and operation of the battery cover opening/closing device, the opening/closing bar 22 is fitted in the entry hindrance hole 20b of the opening/closing hole means 20 when the power switch manipulator 11 is in the position of turning on the power switch. In that state, even if the cover opening/closing button 21 is pressed, the button cannot be moved because of the small diameter of the entry hindrance hole 20b located at the button, as shown in FIG. 2B. For that reason, the engaging portion 42 of the cover 41 remains engaged with the engaging arm 33, despite the pressing of the button 21, so that the cover cannot be opened. On the other hand, if the power switch manipulator 11 is slid into the position of turning off the power switch, the entry allowance hole 20a is moved so that the axis of the hole coincides with that of the cover opening/closing button 21, as shown in FIG. 2A. For that reason, the button 21 can then be pressed so as to be moved as shown in FIG. 2C, so that the opening/closing bar 22 is moved in the same direction as the button against the force of the plate spring 19. Because of that movement of the bar 22, the push flange 23 pushes the moving connection arm 31 of the cover opening/closing arm means 30 to turn the arm means counterclockwise with regard to FIG. 1, to disengage the engaging claw 33a of the engaging arm 33 from the engaging portion 42. At that time, the spring force transmission arm 43 is turned together with the cover opening arm means 30 in the same direction as the latter, and the cover moving connection arm 35 is also turned counterclockwise through the action of the tension spring 40. As a result, the moving connection part 38 of the arm 35 pushes the inside surface of the battery cover 41 so that the cover is opened. At that time, the engaging projection 36 is engaged with the engaging flange 24 of the opening/closing bar 22 so that the bar is kept in a cover opening position. When the cover 41 is thereafter closed, the inside surface thereof pushes the moving connection part 38 so that the cover moving connection arm 35 is turned clockwise against the force of the tension spring 40. As a result the engaging projection 36 is disengaged from the engaging flange 24, and the opening/closing bar 22 is returned to such a cover closing position by the force of the plate spring 19 that the bar projects together with the cover opening/closing button 21. At the same time, the spring force transmission arm 43 coupled to the cover moving connection arm 35 by the tension spring 40 is turned clockwise to turn the cover opening/closing arm means 30 clockwise to engage the engaging claw 33a of the engaging arm 33 with the engaging portion 42. If the power switch manipulator 11 is then slid into the position of turning on the power switch the cover opening/closing button 21 is locked again.

Figure 3:
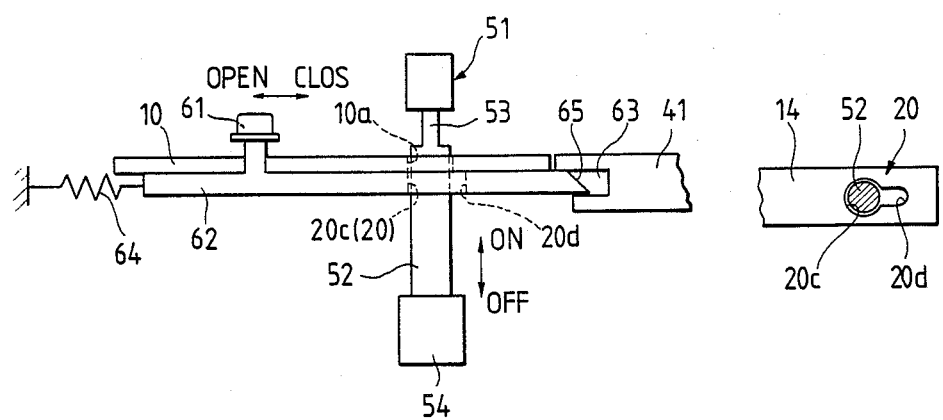
FIGS. 3 and 4 are views of a major part of a device which is another embodiment of the present invention and which is for opening and closing a cover for a battery.
Figure 4:
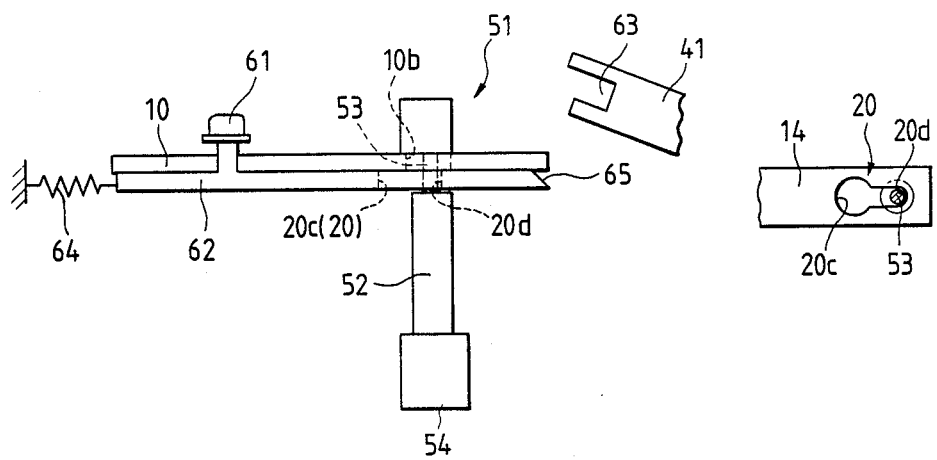

FIGS. 3 and 4 show a device according to another embodiment for opening and closing a cover for a battery for a magnetic recorder whose internal mechanism is driven by the electric power of the battery. The power switch manipulator 51 of the device is of the type which is pressed for operation. The cover opening/closing knob 61 of the device is of the type which is slid for operation. The knob 61 is coupled to a slide-locking plate 62 slidable rightward and leftward on the inside surface of the main plate 10 of the magnetic recorder. The manipulator 51 extends through the guide hole 10a of the main plate 10 and the opening/closing hole means 20 of the slide-locking plate 62, and is movingly coupled to a power switch 54. The slide-locking plate 62 is slid in the same manner as the slide-locking plate 14 in the preceding embodiment. The tip of the slide-locking plate 62 engages and disengages an engaging recess 63 of the battery cover 41. A compressed spring 64 urges the slide-locking plate 62 in such a direction as to engage the tip thereof into the recess 63. The tip of the plate 62 has a slope 65, which slides on the end portion of the cover 41.

The opening/closing hole means 20 consists of an entry allowance hole 20c of large diameter and an entry hindrance hole 20d of small diameter in the same manner as the preceding embodiment. The power switch manipulator 51 includes a large-diameter portion 52 corresponding in diameter to the entry allowance hole 20c, and a small-diameter portion 53 corresponding in diameter to the entry hindrance hole 20d. When the large-diameter portion 52 of the manipulator 51 is in the entry allowance hole 20c, the slide-locking plate 62 is in a locking position. When the small-diameter portion 53 of the manipulator 51 is in the entry hindrance hole 20d, the slide-locking plate 62 is in an unlocking position. When the large-diameter portion 52 of the power switch manipulator 51 is in the entry allowance hole 20c as shown in FIG. 3, the slide-locking plate 62 is prevented from being slid into the unlocking position. At that time, the manipulator 51 is in the position of turning on the power switch 54, and the slide-locking plate 62 is in the locking position so that the battery cover 41 cannot be opened. On the other hand, when the manipulator 51 is pushed into the position of turning off the power switch 54, the small-diameter portion 53 of the manipulator engages the entry allowance hole 20c so that the slide-locking plate 62 can be slid rightward and leftward, as shown in FIG. 4. If the plate 62 is then slid into the unlocking position by operating the cover opening/closing knob 61 against the force of the compressed spring 64, the tip of the plate is disengaged out of the engaging recess 63 so that the cover 41 can be opened. When the operating force on the knob 61 is then removed therefrom, the slide-locking plate 62 is slid into the locking position by the force of the compressed spring 64 so that the slope 65 of the tip of the plate is engaged with the battery cover 41. When the cover 41 is thereafter closed, the end thereof comes into pressure contact with the slope 65 of the plate 62 so that the plate is moved into the unlocking position. When the cover 61 is completely closed, the plate 62 is slid into the locking position by the force of the compressed spring 64 so that the tip of the plate is engaged into the engaging recess 63.

According to the present invention, a cover opening/closing member cannot be moved into a battery cover opening position when a power switch manipulator is in the position of turning on a power switch. For that reason, a battery cover is prevented from being opened as the power switch remains turned on, to cause such a trouble as that the magnetic head of a magnetic recorder or the like is left in contact with a floppy disk or the like and plastically deforms it.

What is claimed is:

1. A device for opening and closing a cover for a battery, comprising:
   a cover opening member for opening said cover;
   a power switch manipulator for turning on and off a power switch for the electric power of said battery; and
   a safety mechanism for enabling the opening operation of said member only when said manipulator is in the position of turning off said switch, and for preventing movement of said manipulator to a position for turning on said power switch when said cover is open, said safety mechanism being disposed between said member and said manipulator.

2. A device according to the claim 1 wherein the cover opening member is pressed for operation and the power switch manipulator is slid for operation, and wherein said safety mechanism comprises a slide-locking plate disposed on said manipulator integrally therewith, said slide-locking plate having an opening/closing hole means in which a bar coupled to said member integrally therewith is fitted said means including an entry hindrance hole which does not allow said member to be pressed to open the cover when said manipulator is in the position of turning on the power switch, and an entry allowance hole which is continuous to said entry hindrance hole and allows said member to be pressed to open said cover when said manipulator is in the position of turning off said switch.

3. A device according to the claim 1 wherein the cover opening member is slid for operation and the power switch manipulator is pressed for operation, and wherein said safety mechanism comprises a slide-locking plate disposed on said member integrally therewith, said plate having an opening/closing hole means in which a bar coupled to said manipulator integrally therewith is fitted, said means including an entry hindrance hole which does not allow said member to be slid to open the cover when said manipulator is in the position of turning on the power switch, and an entry allowance hole which is continuous to said entry hindrance hole and allows said member to be slid to open said cover when said manipulator is in the position of turning on said switch.

* * * * *